United States Patent [19]

Takeuchi

[11] Patent Number: 5,661,239
[45] Date of Patent: Aug. 26, 1997

[54] ELECTRONIC PARTS-MOUNTING APPARATUS

[75] Inventor: Takayoshi Takeuchi, Gunma-ken, Japan

[73] Assignee: Sanyo Electric Co., Ltd., Osaka-fu, Japan

[21] Appl. No.: 684,951

[22] Filed: Jul. 19, 1996

[30] Foreign Application Priority Data

Jul. 19, 1995 [JP] Japan ..................................... 7-205152

[51] Int. Cl.$^6$ ........................................................ H05K 3/30
[52] U.S. Cl. ............................................. 73/432.1; 29/743
[58] Field of Search .............................. 29/743; 73/432.1; 248/682; 209/556, 573, 574, 575, 632, 633

[56] References Cited

U.S. PATENT DOCUMENTS

| | | |
|---|---|---|
| 4,745,295 | 5/1988 | Seno et al. . |
| 4,905,370 | 3/1990 | Hineno et al. . |
| 5,285,946 | 2/1994 | Tomigashi et al. . |

*Primary Examiner*—Robert Raevis
*Attorney, Agent, or Firm*—Darby & Darby

[57] ABSTRACT

An electronic parts-mounting apparatus includes at least one mounting head with a plurality of sucking nozzles mounted thereon extending downward for use in sucking an electronic part. The at least one mounting head is intermittently moved by rotation of a rotary table and stopped at a plurality of stop positions including a mounting station at which an electronic part is mounted nozzles mounted on the mounting head, at least one on a circuit board by each of the plurality of sucking nozzle-adjusting station at which a sucking nozzle corresponding to the electronic part is selected from the plurality of sucking nozzles and the sucking nozzle corresponding to the electronic part is placed in a predetermined active position in which the sucking nozzle corresponding to the electronic part is capable of a sucking operation before sucking of the electronic part, and a sucking station at which the electronic part is sucked by the sucking nozzle corresponding to the electronic part, in a mentioned order at least with respect to the mounting station, the at least one nozzle-adjusting station, and the sucking station. An excessively downward projecting state of any of the plurality of the sucking nozzles in the active position is detected between the mounting station and the at least one nozzle-adjusting station.

5 Claims, 4 Drawing Sheets

ELECTRONIC PARTS-MOUNTING APPARATUS

BACKGROUND OF THE INVENTION

1. Field of the Invention

This invention relates to an electronic parts-mounting apparatus which intermittently moves mounting heads having sucking nozzles each extending downward for being employed in sucking an electronic part and mounting the sucked electronic part on a circuit board.

2. Prior Art

Conventionally, an electronic parts-mounting apparatus of this kind has been proposed by Japanese Laid-Open Patent Publication (Kokai) No. 5-226884, which includes a main unit, a feeding section for feeding electronic parts to the main unit, and a mounting section for mounting the electronic parts on a circuit board, with the feeding section and the mounting section being arranged on opposite sides of the main unit in a fashion parallel to each other. The main unit includes a rotary table and twelve mounting heads arranged on an outer periphery of the rotary table at equally spaced intervals. Each of the mounting heads carries six sucking nozzles. The rotary table is intermittently rotated to thereby move the mounting heads between the feeding section and the mounting section in a rotational manner. During intermittent rotation of the rotary table, each sucking nozzle selected for operation picks up an electronic part by sucking and mounts the same on a circuit board at the mounting section.

Along a movement path of the sucking nozzles from a sucking station in the feeding section, at which electronic parts are sucked, to a mounting station in the mounting section, at which the sucked electronic parts are mounted on a circuit board, there are provided stations at which devices make access to the sucking nozzles e.g. for recognizing a position or orientation of a sucked electronic part based on a sensed image thereof, and for correcting the position or orientation of the same. Further, along the remaining movement path of the sucking, nozzles from the mounting station to the sucking station, there are provided other stations at which devices make access to the sucking nozzles e.g. for selecting one of sucking nozzles of each of the mounting head for operation, and for adjusting a level of the selected sucking nozzle. At a station immediately preceding the sucking station, the position of a selected sucking nozzle is corrected in a transverse direction, while a device is provided for detecting a degree of projection of the selected sucking nozzle and degrees of projection of the other nozzles.

The six sucking nozzles are carried by each mounting head in a manner extending downward therefrom and retracted upward therein. The six nozzles are removably provided so as to permit replacement thereof according to the kind of electronic parts to be mounted on the circuit board as desired. The replacement work is typically carried out at the mounting station.

According to the proposed electronic parts-mounting apparatus, however, sucking nozzles are replaced (removed and mounted) at the sucking station, whereas detection of a degree of projection of each nozzle is carried out at a station immediately preceding the sucking station. Therefore, if a sucking nozzle excessively projects downward due to a mounting error, there is a fear that the sucking nozzle projecting downward from the mounting head collides against a component part of the main unit, resulting in breakage of the sucking nozzle or the component part.

Further, when the sucking nozzle progressively projects downward due to looseness of a screw for fixing the same, a check made at a single point along the circumference of the main unit i.e. at the station immediately preceding the sucking station cannot ensure timely detection of such a faulty sucking nozzle.

SUMMARY OF THE INVENTION

It is the object of the invention to provide an electronic parts-mounting apparatus which is capable of quickly detecting an excessively downward projecting state of a sucking nozzle.

To attain the above object, according to a first aspect of the invention, there is provided an electronic parts-mounting apparatus including at least one mounting head, a plurality of sucking nozzles each mounted on each of the at least one mounting head in a fashion extending downward for use in sucking an electronic part, intermittent rotation means for intermittently moving the at least one mounting head by rotation thereof, at least one nozzle-adjusting station at which a sucking nozzle corresponding to the electronic part is selected from the plurality of sucking nozzles, and the sucking nozzle corresponding to the electronic part is placed in a predetermined active position in which the sucking nozzle corresponding to the electronic part is capable of performing sucking operation before sucking of the electronic part, a sucking station at which the electronic part is sucked by the sucking nozzle corresponding to the electronic part, and a mounting station at which the electronic part is mounted on a circuit board and each of the plurality of sucking nozzles is mounted on the mounting head, the intermittent rotation means causing the at least one mounting head to stop at a plurality of stop positions including the mounting station, the at least one nozzle-adjusting station, and the sucking station, in a mentioned order at least with respect to the mounting station, the at least one nozzle-adjusting station, and the sucking station.

The electronic parts-mounting apparatus according to the first aspect of the invention is characterized by comprising nozzle level-detecting means arranged between the mounting station and the at least one nozzle-adjusting station for detecting an excessively downward projecting state of any of the plurality of the sucking nozzles in the active position.

According to this construction, the nozzle level-detecting means detects an excessively downward projecting state of any of the plurality of the sucking nozzles in the predetermined active position, between the mounting station and the at least one nozzle-adjusting station. Therefore, it is possible to detect a sucking nozzle which projects excessively downward from the mounting head due to a mounting error or looseness of a screw fixing the same before the sucking nozzle reaches the at least one nozzle-adjusting station. This makes it possible to prevent the sucking nozzle in its excessively downward projecting state from going through the at least one nozzle-adjusting station at which devices are provided for making access to the sucking nozzles.

Preferably, the nozzle level-detecting means is comprised of a contact block for being brought into contact with the any of the plurality of the sucking nozzles in the excessively downward projecting state in the active position to be displaced thereby, and a detecting block for detecting displacement of the contact block to thereby detect the excessively downward projecting state of any of the plurality of the sucking nozzles in the active position.

For example, the detecting block comprises a proximity sensor.

More preferably, the contact block is formed by part-removing means arranged in a manner such that the any of the plurality of the sucking nozzles in the active position passes immediately above the part-removing means, thereby also serving as means for being brought into contact with an electronic part mounting of which has been canceled, to thereby remove the electronic part mounting of which has been canceled from the sucking nozzle.

According to a second aspect of the invention, there is provided an electronic parts-mounting apparatus including sucking nozzles for sucking electronic parts, intermittent rotation means for intermittently moving the sucking nozzles, and part-removing means arranged in a manner such that any of the plurality of the sucking nozzles in a predetermined active position for performing sucking operation passes immediately above the part-removing means, whereby the part-removing means being brought into contact with an electronic part mounting of which has been canceled to thereby remove the electronic part mounting of which has been canceled from the sucking nozzle.

The electronic parts-mounting apparatus according to the second aspect of the invention is characterized by comprising a detector for detecting displacement of the part-removing means.

According to this construction, when a sucking nozzle is properly mounted on the mounting head and placed in the predetermined active position, a front or lower end of the sucking nozzle in the predetermined active position passes immediately above the part-removing means, whereas when a sucking nozzle is improperly mounted, a front or lower end of this sucking nozzle interferes with the part-removing means to displace the same. That is, the part-removing means for removing the electronic part away from the sucking nozzle is utilized to detect such an improperly mounted sucking nozzle. Further, this part-removing means is provided at a station between the mounting station and the at least one nozzle-adjusting station so as not to cause trouble in adjustment of the sucking nozzle. This makes it possible to prevent the excessively downward projecting sucking nozzle from going through the at least nozzle-adjusting station.

The above and other objects, features, and advantages of the invention will become more apparent from the following detailed description taken in conjunction with the accompanying drawings.

DETAILED DESCRIPTION

The invention will now be described in detail with reference to the drawings showing an embodiment thereof.

Figure 1:
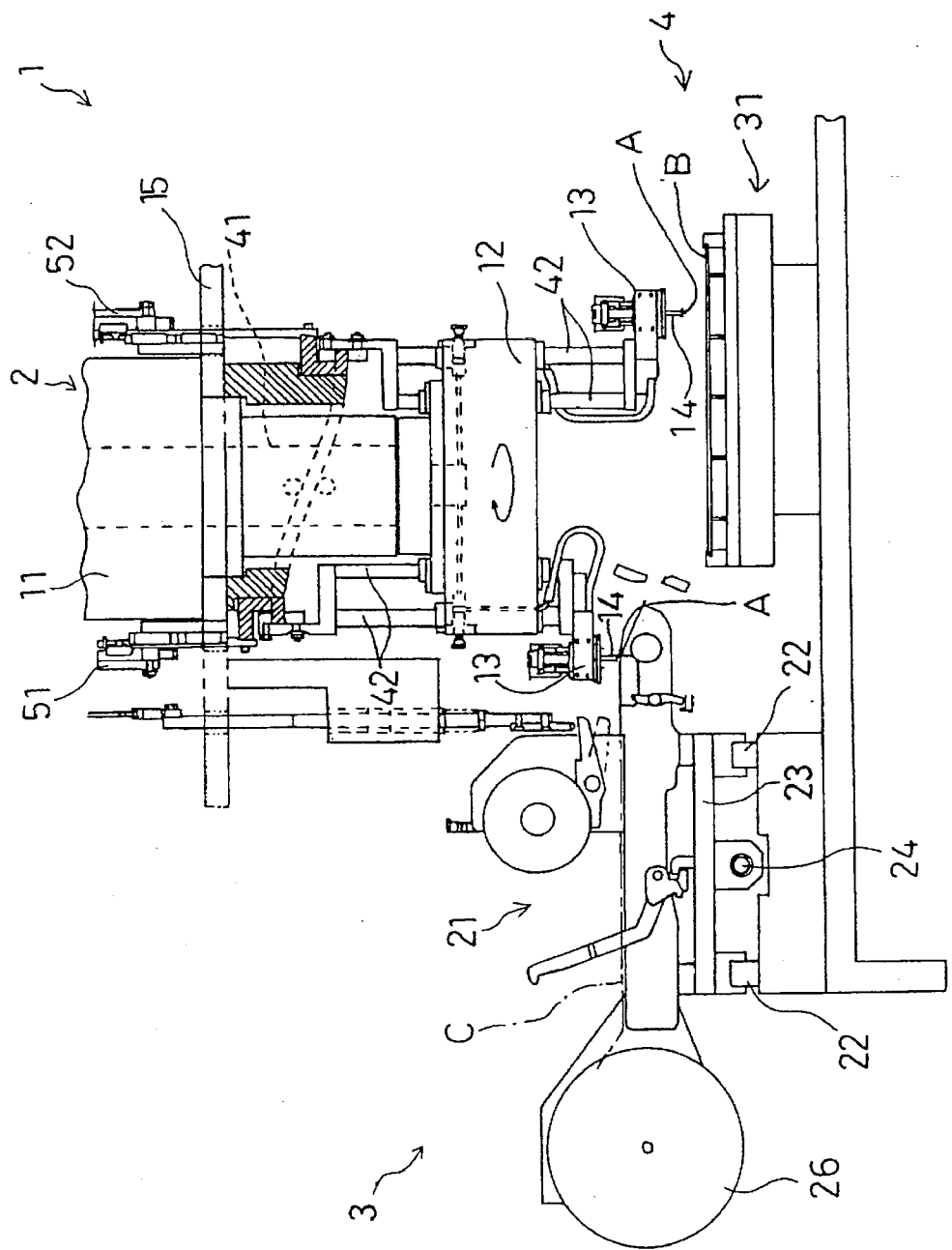
FIG. 1 is a side view showing an electronic parts-mounting apparatus according to one embodiment of the invention.
Figure 2:
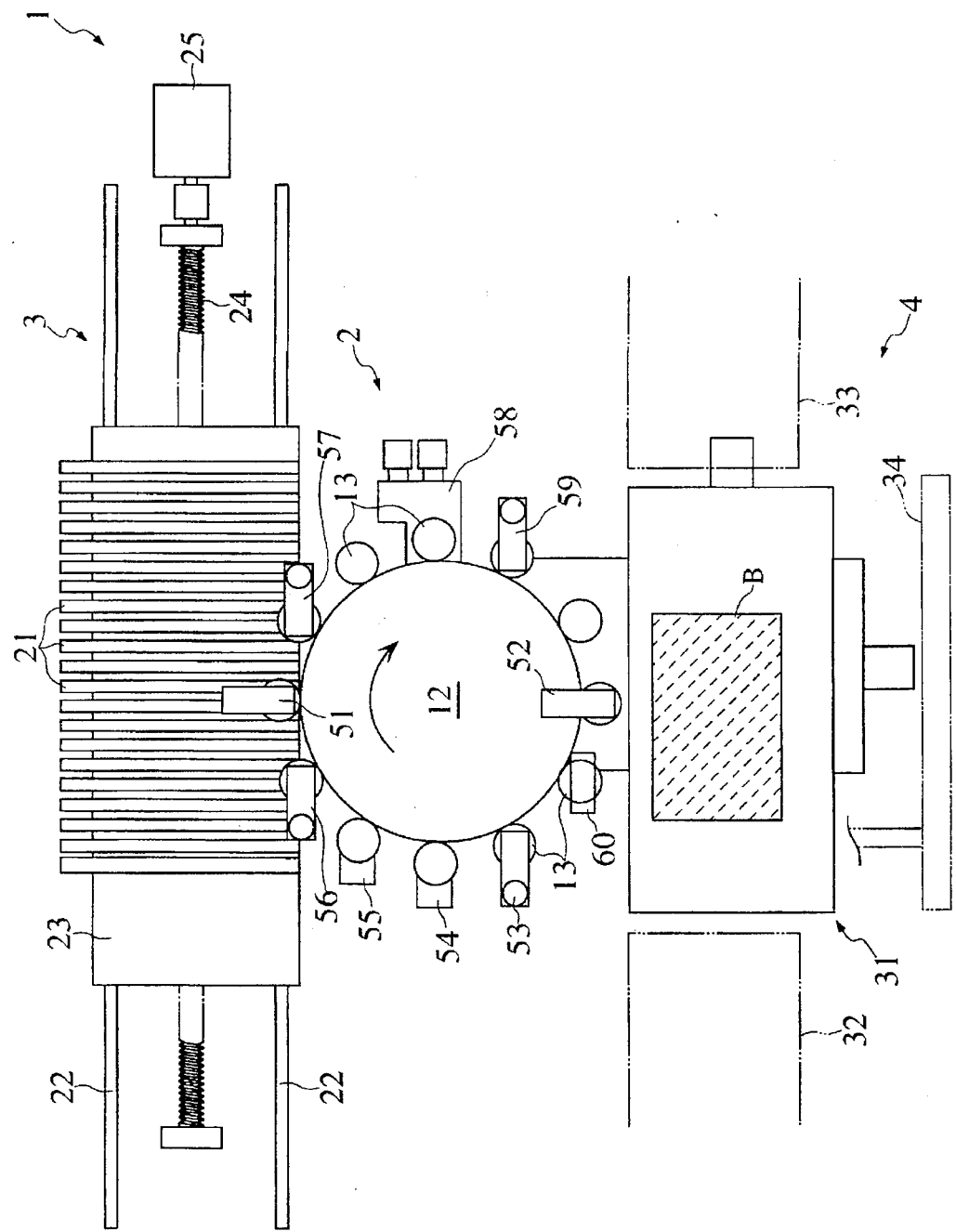
FIG. 2 is a plan view showing the FIG. 1 electronic parts-mounting apparatus.

Referring first to FIGS. 1 and 2, there is shown an electronic parts-mounting apparatus 1 according to the embodiment of the invention, which includes a main unit 2, a feeding section 3 for feeding electronic parts A, and a mounting section 4 for mounting the electronic parts A on a circuit board B, with the feeding section 3 and the mounting section 4 being arranged on opposite sides of the main unit 2 in a fashion parallel to each other. The main unit 2 is comprised of an index unit 11 which forms a main part of the driving system of the apparatus, a rotary table 12 connected thereto, and a plurality of (twelve) mounting heads 13 arranged on the outer periphery of the rotary table 12. The rotary table 12 is intermittently rotated in angular increments corresponding to the number of the mounting heads 13. With intermittent rotation of the rotary table 12, a selected one of sucking nozzles carried by each mounting heads 13 is brought to predetermined positions facing the feeding section 3 and the mounting section 4, in a predetermined sequence, whereby each selected sucking nozzle 14 sucks an electronic part A supplied at the feeding section 3, carries the same to the mounting section 4 through intermittent rotation of the rotary table 12, and mounts the same on the circuit board B supplied at the mounting section 4.

The feeding section 3 has tape cassettes 21 corresponding in number to the number of kinds of electronic parts A to be mounted on the circuit board B. The tape cassettes 21 are removably mounted on a feed table 23 in a fashion transverse to the directions of forward/backward movements of the feed table 23 in parallel with each other. The feed table 23 is slidably guided by a pair of guide rails 22, 22. A ball screw 24 extends through the feed table 23 in a direction of sliding advance thereof (direction of forward movement thereof), whereby the feed table 23 is moved forward and backward by respective normal and reverse rotations of a feed motor 25 connected to one end of the ball screw 24, to selectively bring a selected one of the tape cassettes 21 to a position in which the selected tape cassette 21 faces a mounting head 13 in its sucking position. Each tape cassette 21 has a carrier tape C installed thereon, which carries electronic parts A thereon at intervals of a predetermined pitch and is wound around a tape reel 26, and the electronic parts A are sequentially picked up by a corresponding one of the sucking nozzles 14 by sucking from the carrier tape C unwound from the tape reel 26.

The mounting section 4 is comprised of an X-Y table 31 for moving the circuit board B placed thereon in the directions of an X axis and a Y axis, a feed conveyor 32 and a delivery conveyor 33 arranged to face respective opposite longitudinal ends of the X-Y table 31, and a circuit board transfer device 34 for transferring a circuit board B on the feed conveyor 32 onto the X-Y table 31 and at the same time transferring a preceding circuit board B already placed on the X-Y table onto the delivery conveyor 33. That is, the circuit board B sent to a downstream end of the feed conveyor 32 is transferred by the circuit board transfer device 34 onto the X-Y table 31, and at the same time, the circuit board B having the electronic parts A mounted thereon is transferred by the circuit board transfer device 34 onto the delivery conveyor 33. The circuit board B placed on the X-Y table 31 is moved to its predetermined positions by the X-Y table 31 such that specific portions thereof are sequentially brought to a position in which each of them faces the corresponding one of the sucking nozzles 14 in its mounting position, whereby the electronic parts A carried by the mounting heads 13 one after another are mounted at the specific portions of the circuit board, respectively.

The index unit 11 of the main unit 2, which forms the main part of the whole driving system of the apparatus, is supported by a support table 15. The index unit 11 intermittently rotates the rotary table 12, amd at the same time causes various devices mounted on the main unit to operate in a manner synchronous with a repetition period of intermittent rotation of the rotary table 12.

The rotary table 12 is rigidly mounted on a vertical shaft 41 extending perpendicularly downward from the index unit 11 and is driven for clockwise intermittent rotation as viewed in FIG. 2. The twelve mounting heads 13 are each arranged at circumferentially spaced intervals along the periphery of the rotary table 12 by way of a pair of rods 42, 42 such that they can be moved upward and downward. In the present embodiment, the rotary table 12 performs twelve intermittent rotations or index motions to make one complete rotational turn in a manner corresponding to the number of mounting heads 13. The mounting heads 13, which intermittently move about the rotational axis of the rotary table 12, are sequentially brought to twelve stop positions including a sucking station in the feeding station, at which an electronic part is sucked by a sucking nozzle 14, and a mounting station in the mounting section, at which the sucked electronic part is mounted on a circuit board, by turns.

Each mounting head 13 carries a plurality of (five, in the present embodiment) sucking nozzles 14 which are circumferentially arranged at equally spaced intervals in a manner extending downward such that a selected one of the sucking nozzles 14 can be projected downward therefrom and retracted upward therein and the sucking nozzles 14 as a whole can be moved about a vertical axis of the mounting head 13. The five sucking nozzles 14 of five kinds are used to permit selection of a suitable one therefrom which corresponds to the size or the like of an electronic part A. This selection of a sucking nozzle 14 is made effective by moving the selected sucking nozzle 14 about the vertical axis of the mounting head 13 to a nozzle-setting position and causing the same to project out. The five sucking nozzles 14 are constructed such that they can be removed from the mounting head 13 for replacement as desired. The replacement of sucking nozzles 14 is carried out at the mounting station.

On the other hand, various devices are mounted on the support table 15 to be incorporated into the apparatus for making access to the sucking nozzles 14 as the rotary table 12 is stopped during its intermittent rotation at the twelve stop stations, such as the sucking station and the mounting station.

At the sucking station, a mounting head-lifting/lowering device 51 is arranged for being linked with the rods 42, 42 to lower the mounting head 13 for causing the same to suck an electronic part A. At the mounting station, a mounting head-lifting/lowering device 52 is arranged similarly for lowering the mounting head 13 to mount the electronic part A sucked thereby on the circuit board B. The mounting head-lifting/lowering devices 51, 52 are identical in the basic construction except for their different arm lengths.

Further, as shown in FIG. 2, at a first nozzle adjustment station which is clockwise second next to the mounting station as viewed in FIG. 2, a nozzle selector 53 is provided which moves the sucking nozzles 14 about the vertical axis of the mounting head 13 to thereby bring a sucking nozzle 14 selected for operation to the nozzle-setting position at an outer location. At a second nozzle adjustment station following the first nozzle adjustment station, a nozzle projector/retractor 54 is provided for lowering the mounting head 13 until it strikes a stopper, not shown, to thereby cause the sucking nozzles 14 which are not selected for operation to retract, and for lifting the mounting head 13 to cause the selected sucking nozzle 14 to project downward therefrom. At a third nozzle adjustment station following the second nozzle adjustment station, a nozzle length-adjusting device 55 is provided which adjusts the length of projected part of the sucking nozzle 14.

Similarly, at the following station which immediately precedes the sucking station, a nozzle position-correcting device 56 is provided which moves the sucking nozzle 14 about the vertical axis of the mounting head 14 to thereby correct the position of the sucking nozzle 14, which is to be brought to the sucking point, in a transverse direction, i.e. in a direction perpendicular to the directions of forward/backward movements of the feed table 23. It should be noted that at this station, there is also arranged a device for detecting a level of the sucking nozzle 14 projected out for operation and levels of the other sucking nozzles 14 which are not selected for operation.

At a station following the sucking station, a nozzle-returning device 57 is provided which moves the sucking nozzle 14 about the vertical axis of the mounting head to its original nozzle-setting position. At a station which is second next to the station following the sucking station, a part-recognizing device 58 is provided which recognizes an orientation (on a horizontal plane) of the sucked electronic part A based on a sensed image thereof, and at the following station, a part angle-correcting device 59 is arranged which moves the sucking nozzle 14 about the vertical axis of the mounting head 13 based on results of recognition of the electronic part A by the part-recognizing device 58, to thereby correct the orientation of the sucked electronic part A such that it is suitable for mounting of the same.

Further, at a part-discharging station following the mounting station, a part-discharging device 60 is provided for removing an electronic part A, the position or orientation of which is determined by the part-recognizing device 58 to be uncorrectable and hence mounting of which is canceled, from the sucking nozzle 14. The part-discharging device 60 also serves as nozzle level-detecting means for detecting a mounting error of a sucking nozzle on a mounting head 13, as will be described in detail hereinafter.

Now, a sequence of the whole operation of the main unit 2 will be briefly described by taking operations of one of the mounting heads 13 as an example. After the mounting head 13 has mounted an electronic part A on the circuit board B at the mounting station, the mounting head 13 is moved about the vertical axis of the mounting head 13 toward the sucking station by intermittent rotation of the rotary table 12. Before the mounting head 13 reaches the sucking station, selection of a sucking nozzle 14, projection/retraction of the sucking nozzles 14, adjustment of a projected part of the selected sucking nozzle 14, and correction of the position of the selected sucking nozzles 14 are sequentially effected in response to control commands for the mounting head 13. On the other hand, in the sucking section 3, as the mounting head 13 is moved from the station immediately preceding the sucking station to the sucking station, the feed table 23 is moved forward or backward to bring one of the tape cassettes 21 which corresponds to the selected sucking nozzle 14 to the sucking station in response to control commands.

The mounting head 13 sucks an electronic part A at the sucking station, and now is moved about the rotational axis of the rotary table 12 toward the mounting station. Before the mounting head 13 reaches the mounting station, returning of the sucking nozzle 14 to the nozzle-setting position, recognition of the sucked electronic part A, and correction of angle or orientation of the electronic part A based on results of the recognition are sequentially effected for the mounting head 13. On the other hand, in the mounting section, as the mounting head 13 is moved from the station immediately preceding the mounting station to the mounting station, the X-Y table 31 is moved in response to control commands, thereby bringing a portion of the circuit board B at which the electronic part A is to be mounted to the mounting station. Then, the mounting head-lifting/lowering device 52 lowers the mounting head 13 to thereby mount the electronic part A on the circuit board B.

Figure 3A:
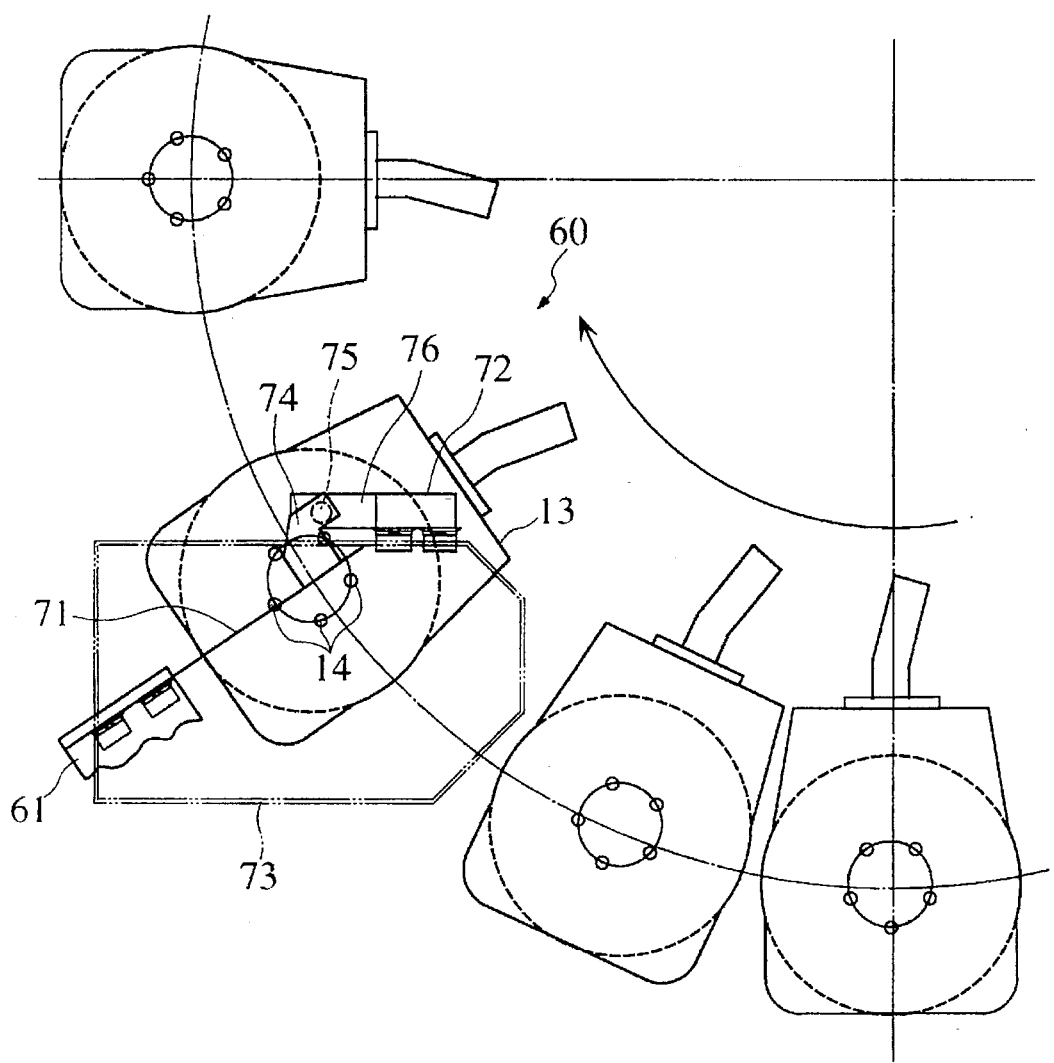
FIG. 3A is a plan view showing a part-discharging device of a main unit of the FIG. 1 electronic parts-mounting apparatus, in operation for removing a chip from a sucking nozzle.
Figure 3B:
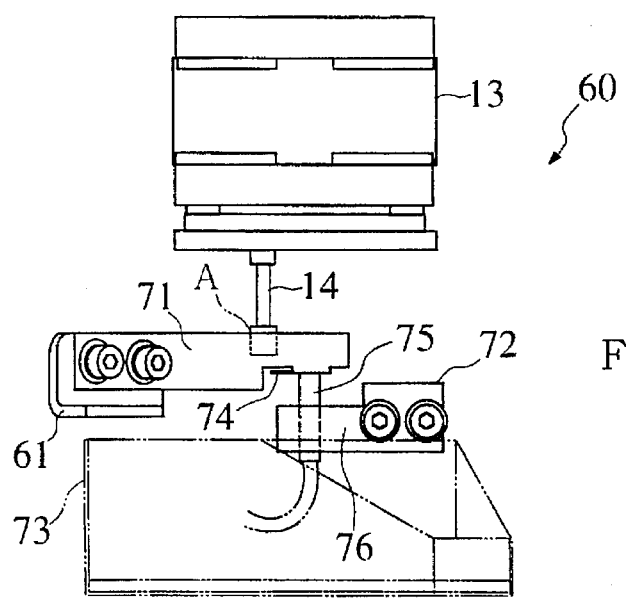
FIG. 3B is a side view showing the FIG. 3A part-discharging device.

Next, the part-discharging device 60 will be described with reference to FIGS. 3A to 3B. As shown in these figures, the part-discharging device 60 is comprised of a chip stopper 71 for being brought into contact with the electronic part A to stop the same and thereby cause the same to fall off the sucking nozzle 14, a detector 72 for detecting displacement of the chip stopper 71, and a box 73 for receiving the electronic part A dropped from the sucking nozzle 14. The chip stopper 71, which is in the form of a thin plate disposed such that its flat wide surfaces face horizontally, has one end thereof fixed to a chassis 61, and horizontally extends therefrom to an area immediately below the path of the sucking nozzle 14. A front end of each sucking nozzle 14 which is intermittently rotated passes immediately above the chip stopper 71, and an electronic part A remaining on the sucking nozzle 14 due to cancellation of mounting thereof collides against the chip stopper 71 to drop into the box 73 below. In this connection, the sucking of the electronic part A by reduced air pressure in the sucking nozzle 14 is canceled before the sucking nozzle 14 reaches the chip stopper 71.

A front end portion of the chip stopper 71 is bent at a lower edge thereof into a bent portion 74 which extends horizontally to an area opposed to a proximity sensor 75 of the detector 72. The detector 72 is comprised of the proximity sensor 75 and a holder 76 which is rigidly fixed to a chassis, not shown, for holding the proximity sensor 75. When the chip stopper 71 is displaced to bring the bent portion 74 out of the area opposed to the proximity sensor 75, a mounting error of the sucking nozzle 14 is detected.

Figure 4A:
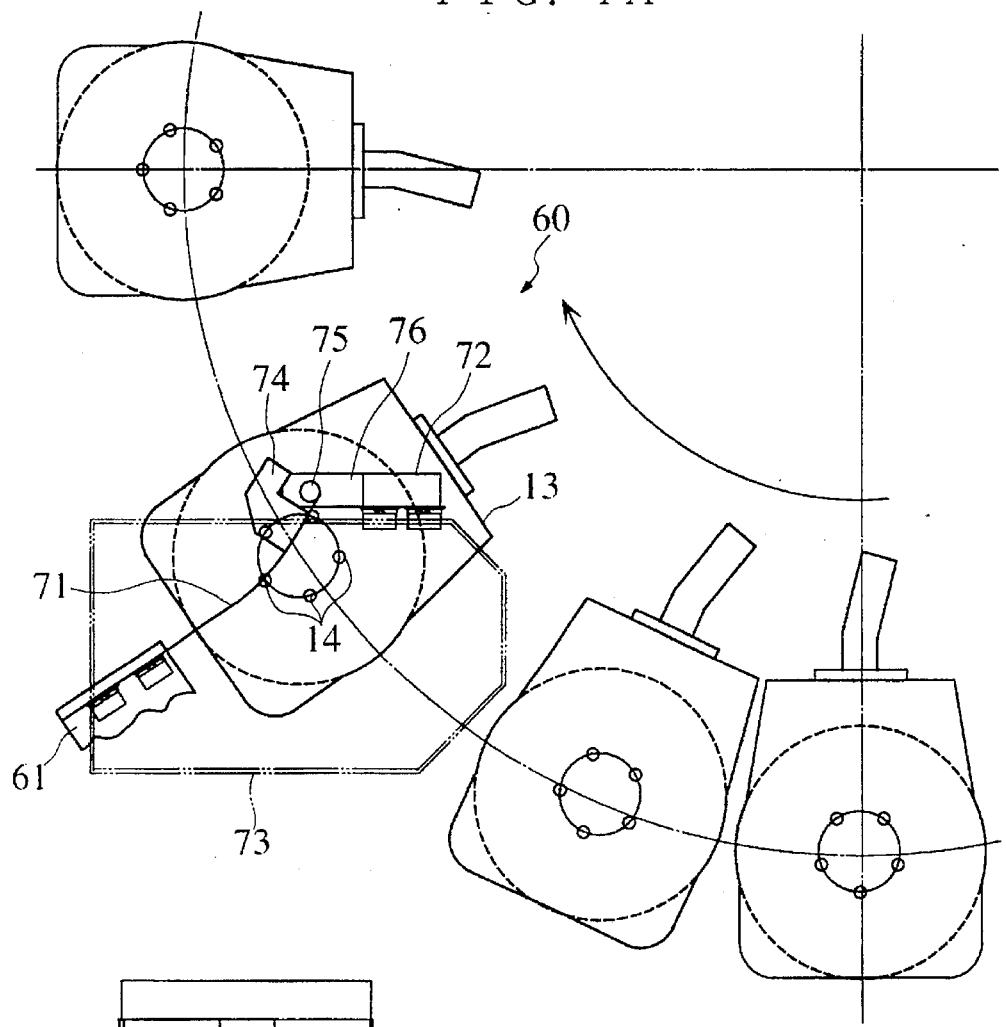
FIG. 4A is a plan view showing the part-discharging device in operation for detecting a sucking nozzle which is not correctly mounted.
Figure 4B:
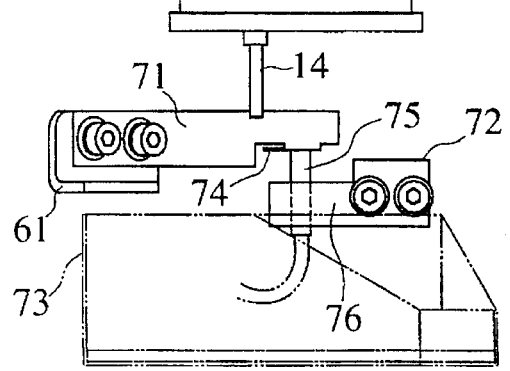
FIG. 4B is a side view showing the FIG. 4A part-discharging device.

As shown in FIGS. 4A and 4B, if a sucking nozzle 14 mounted on the mounting head 13 at the mounting station is in a state excessively projecting downward due to a mounting error, the sucking nozzle 14 which is moved to the part-discharging device 60 by intermittent rotation of the rotary table 12 interferes with the chip stopper 71. This interference causes the chip stopper 71 to be pushed forward to be bent, and further twisted to thereby permit the sucking nozzle 14 to move over the chip stopper 71, followed by the chip stopper 71 returning to its original position. As the chip stopper 71 is bent, the bent portion 74 of the chip stopper 71 is progressively moved away from the area opposed to the proximity sensor 75, whereby displacement of the chip stopper 71, i.e. an excessively downward projecting state of the sucking nozzle 14 is detected. When this state of the sucking nozzle 14 is detected, the operation of the electronic parts-mounting apparatus is stopped.

As described above, according to the present embodiment, a mounting error of a sucking nozzle 14 is detected before the sucking nozzle 14 reaches locations, such as stations at which the nozzle-selecting device 53, the nozzle-projecting/retracting device 54, and the nozzle length-adjusting device 55 make access to the sucking nozzle 14. Therefore, intermittent movement of the sucking nozzle 14 is stopped thereby preventing the sucking nozzle 14 excessively projecting downward from interfering with a component part of the electronic parts-mounting apparatus, such as the stopper of the nozzle-projecting/retracting device 54. This makes it possible to prevent the sucking nozzle 14 and such a component part of the apparatus from being broken due to a mounting error of the sucking nozzle 14, looseness of a screw, or the like. Further, the detector can be constructed easily at a low cost, since a sucking nozzle excessively projecting downward is detected by the use of the chip stopper 71.

Further, although according to the present embodiment, detecting means for detecting an excessively downward projecting state of a sucking nozzle is constructed by the use of the chip stopper, this is not limitative but the detecting means may be constructed by the use of an optical sensor, in a manner separate from the chip stopper. Further, the detecting means may be constructed by a photointerrupter or a microswitch, instead of the proximity sensor.

It is further understood by those skilled in the art that the foregoing is a preferred embodiment of the invention, and that various changes and modifications may be made without departing from the sprit and scope thereof.

What is claimed is:

1. In an electronic parts-mounting apparatus including at least one mounting head, a plurality of sucking nozzles mounted on each of-said at least one mounting head so as to extend downward for use in sucking an electronic part, intermittent rotation means for intermittently moving said at least one mounting head by rotation thereof, at least one nozzle-adjusting station at which a sucking nozzle corresponding to a said electronic part being selected from said plurality of sucking nozzles, and said sucking nozzle corresponding to said electronic part being placed in a predetermined active position in which said sucking nozzle corresponding to said electronic part is capable of performing a sucking operation before sucking of said electronic part, a sucking station at which said electronic part is sucked by said sucking nozzle corresponding to said electronic part, and a mounting station at which said electronic part is mounted on a circuit board and each of said plurality of sucking nozzles is mounted on said at least one mounting head, said intermittent rotation means causing said at least one mounting head to stop at a plurality of stop positions including said mounting station, said at least one nozzle-adjusting station, and said sucking station, in the order stated at least with respect to said mounting station, said at least one nozzle-adjusting station, and said sucking station, the improvement comprising nozzle level-detecting means arranged between said mounting station and said at least one nozzle-adjusting station for detecting an excessively downward projecting state of any of said plurality of said sucking nozzles in the said active position.

2. An electronic parts-mounting apparatus according to claim 1, wherein said nozzle level-detecting means comprises a contact block to be brought into contact with any of said plurality of said sucking nozzles in said excessively downward projecting state in said active position of a nozzle to be displaced thereby, and a detecting block for detecting displacement of said contact block to thereby detect said excessively downward projecting state of any of said plurality of said sucking nozzles in its said active position.

3. An electronic parts-mounting apparatus according to claim 2, wherein said detecting block comprises a proximity sensor.

4. An electronic parts-mounting apparatus according to claim 2, wherein said contact block is formed by part-removing means arranged such that any of said plurality of said sucking nozzles in its said active position passes immediately above said part-removing means, thereby also serving as means for being brought into contact with an electronic part mounting which has been canceled to thereby remove said electronic part whose mounting has been canceled from said sucking nozzle.

5. An electronic parts-mounting apparatus including sucking nozzles for sucking electronic parts, intermittent rotation means for intermittently moving said sucking nozzles, and part-removing means arranged in a manner such that any of said plurality of said sucking nozzles which is in a predetermined active position for a performing sucking operation, passes immediately above said part-removing means, whereby said part-removing means is brought into contact with an electronic part whose mounting has been canceled to thereby remove said electronic part, whose mounting has been canceled, from said sucking nozzle, the improvement comprising a detector for detecting displacement of said part-removing means.

* * * * *